(12) United States Patent
Zhang et al.

(10) Patent No.: US 12,543,480 B2
(45) Date of Patent: Feb. 3, 2026

(54) DISPLAY MODULE AND DISPLAY DEVICE

(71) Applicants: YUNNAN INVENSIGHT OPTOELECTRONICS TECHNOLOGY CO., LTD., Yunnan (CN); BOE TECHNOLOGY GROUP CO., LTD., Beijing (CN)

(72) Inventors: Jinhua Zhang, Beijing (CN); Shucheng Yang, Beijing (CN); Dongdong Duan, Beijing (CN); Jie Sun, Beijing (CN); Xiaojun Mao, Beijing (CN); Peng Dong, Beijing (CN); Bingjie Du, Beijing (CN); Linhong Yang, Beijing (CN); Lei Wang, Beijing (CN); Xiuwen Wang, Beijing (CN); Xiaoling Wang, Beijing (CN); Yunlong Ma, Beijing (CN); Xiong Tao, Beijing (CN); Ya Lv, Beijing (CN)

(73) Assignees: Yunnan Invensight Optoelectronics Technology Co., Ltd., Yunnan (CN); BOE Technology Group Co., Ltd., Beijing (CN)

( * ) Notice: Subject to any disclaimer, the term of this patent is extended or adjusted under 35 U.S.C. 154(b) by 190 days.

(21) Appl. No.: 18/028,089

(22) PCT Filed: Jun. 20, 2022

(86) PCT No.: PCT/CN2022/099735
§ 371 (c)(1),
(2) Date: Mar. 23, 2023

(87) PCT Pub. No.: WO2023/245326
PCT Pub. Date: Dec. 28, 2023

(65) Prior Publication Data
US 2024/0315112 A1    Sep. 19, 2024

(51) Int. Cl.
*H10K 59/80*    (2023.01)
*H10K 59/90*    (2023.01)

(52) U.S. Cl.
CPC ........... *H10K 59/873* (2023.02); *H10K 59/90* (2023.02)

(58) Field of Classification Search
None
See application file for complete search history.

(56) References Cited

U.S. PATENT DOCUMENTS

2017/0293194 A1*  10/2017  Hou .................. G02F 1/167
2019/0350081 A1*  11/2019  Park ................. H05K 1/118
(Continued)

FOREIGN PATENT DOCUMENTS

CN    103400537 A    11/2013
CN    106231809 A    12/2016
(Continued)

*Primary Examiner* — Sue A Purvis
*Assistant Examiner* — Jordan M Klein
(74) *Attorney, Agent, or Firm* — The Webb Law Firm

(57) ABSTRACT

The present disclosure provides a display module and a display device. The display module includes: a circuit board including a first surface and a second surface opposite to the first surface; a display substrate on the first surface of the circuit board; a first glue layer on the first surface of the circuit board and surrounding the a sidewall of the display substrate; and a second glue layer on the second surface of the circuit board, wherein a transparency of the second glue layer is different from a transparency of the first glue layer.

20 Claims, 3 Drawing Sheets

(56) References Cited

U.S. PATENT DOCUMENTS

| | | | |
|---|---|---|---|
| 2020/0212132 A1* | 7/2020 | Kim | .................. H10K 71/70 |
| 2020/0212364 A1 | 7/2020 | Kim et al. | |
| 2021/0202460 A1* | 7/2021 | Shin | .................. H01L 25/18 |

FOREIGN PATENT DOCUMENTS

| CN | 107831829 A | 3/2018 |
|---|---|---|
| CN | 207150940 A | 3/2018 |
| CN | 207690831 A | 8/2018 |
| CN | 110225163 A | 9/2019 |
| CN | 209748902 U | 12/2019 |
| CN | 111584552 A | 8/2020 |
| CN | 112086020 A | 12/2020 |
| CN | 113993295 A | 1/2022 |
| CN | 216671067 A | 6/2022 |

* cited by examiner

DISPLAY MODULE AND DISPLAY DEVICE

CROSS-REFERENCE TO RELATED APPLICATIONS

This application is the United States national phase of International Patent Application No. PCT/CN2022/099735, filed on Jun. 20, 2022, the disclosure of which is incorporated by reference herein in its entirety.

BACKGROUND OF THE INVENTION

Field of the Invention

The present disclosure relates to a display module and a display device.

Description of Related Art

At present, application of a display module is more and more extensive. For example, silicon-based OLED (Organic Light Emitting Diode) module technology has been significantly developed. The silicon-based OLED module has the advantages of lightness, thinness, high brightness, low power consumption, fast response, high definition and high luminous efficiency.

SUMMARY OF THE INVENTION

According to an aspect of an embodiment of the present disclosure, there is provided a display module, comprising: a circuit board, comprising a first surface and a second surface opposite to the first surface; a display substrate on the first surface of the circuit board; a first glue layer on the first surface of the circuit board and surrounding a sidewall of the display substrate; and a second glue layer on the second surface of the circuit board, wherein a transparency of the second glue layer is different from a transparency of the first glue layer.

In some embodiments, the transparency of the second glue layer is greater than the transparency of the first glue layer.

In some embodiments, the first glue layer is an non-transparent glue layer; and the second glue layer is a transparent glue layer.

In some embodiments, the circuit board comprises: a non-connecting component and a connecting component on the second surface of the circuit board, wherein the non-connecting component is covered by the second glue layer, and the connecting component is not covered by the second glue layer.

In some embodiments, a thickness of a part of the second glue layer that covers the non-connecting component in a direction perpendicular to the circuit board is greater than a thickness of another part of the second glue layer that does not cover the non-connecting component in the direction perpendicular to the circuit board.

In some embodiments, the thickness of the part of the second glue layer that covers the non-connecting component ranges from 0.2 millimeters to 0.3 millimeters; and the thickness of the another part of the second glue layer that does not cover the non-connecting component ranges from 0.1 millimeters to 0.2 millimeters.

In some embodiments, the first glue layer comprises a soft glue layer; and the second glue layer comprises at least one of a hard glue layer or a soft glue layer.

In some embodiments, the display substrate comprises: a base substrate on the first surface of the circuit board, wherein the base substrate is electrically connected to the circuit board through a conductive connector; a light-emitting structure layer on a side of the base substrate away from the circuit board; and a cover plate on a side of the light-emitting structure layer away from the circuit board, an orthographic projection of the cover plate on the circuit board being inside an orthographic projection of the base substrate on the circuit board; wherein the first glue layer surrounds sidewalls of the base substrate, the light-emitting structure layer, and the cover plate.

In some embodiments, the cover plate comprises: a first sidewall close to the conductive connector, a second sidewall adjacent to the first sidewall, a third sidewall opposite to the first sidewall, and a fourth sidewall opposite to the second sidewall; the base substrate comprises a first edge area, a second edge area, a third edge area and a fourth edge area, wherein the first edge area is an area of the base substrate that is close to the first sidewall and is not covered by the cover plate, the second edge area is an area of the base substrate that is close to the second sidewall and is not covered by the cover plate, the third edge area is an area of the base substrate that is close to the third sidewall and is not covered by the cover plate, and the fourth edge area is an area of the base substrate that is close to the fourth sidewall and is not covered by the cover plate; and the first glue layer comprises: a first portion adjacent to the first sidewall, a second portion adjacent to the second sidewall, a third portion adjacent to the third sidewall, and a fourth portion adjacent to the fourth sidewall, wherein the first portion covers the first edge area of the base substrate, the second portion covers the second edge area of the base substrate, the third portion covers the third edge area of the base substrate, and the fourth portion covers the fourth edge area of the base substrate.

In some embodiments, a width of the first portion in a direction perpendicular to an extension direction of the first sidewall is greater than a width of the second portion in a direction perpendicular to an extension direction of the second sidewall; the width of the first portion in the direction perpendicular to the extension direction of the first sidewall is greater than a width of the third portion in a direction perpendicular to an extension direction of the third sidewall; and the width of the first portion in the direction perpendicular to the extension direction of the first sidewall is greater than a width of the fourth portion in a direction perpendicular to an extension direction of the fourth sidewall.

In some embodiments, the width of the first portion is greater than twice the width of the second portion; the width of the first portion is greater than twice the width of the third portion; and the width of the first portion is greater than twice the width of the fourth portion.

In some embodiments, a width of the second portion in a direction perpendicular to an extension direction of the second sidewall is equal to a width of the third portion in a direction perpendicular to an extension direction of the third sidewall, and the width of the third portion in the direction perpendicular to the extension direction of the third sidewall is equal to a width of the fourth portion in a direction perpendicular to an extension direction of the fourth sidewall.

In some embodiments, the display module further comprises: a third glue layer covering the conductive connector, wherein a length of the third glue layer in a direction parallel to an extension direction of the first sidewall is greater than a length of the first portion of the first glue layer in the direction parallel to the extension direction of the first sidewall.

In some embodiments, a width of the first portion of the first glue layer in a direction perpendicular to the extension direction of the first sidewall is less than a width of the third glue layer in the direction perpendicular to the extension direction of the first sidewall.

In some embodiments, the third glue layer is connected to the first portion of the first glue layer.

In some embodiments, a material of the first glue layer is the same as a material of the third glue layer.

In some embodiments, a surface of the first glue layer away from the first surface of the circuit board is a curved surface.

In some embodiments, a part of the first glue layer is on a surface of the base substrate away from the circuit board and adjacent to sidewalls of the cover plate and the light-emitting structure layer, and another part of the first glue layer is on the first surface of the circuit board and adjacent to a sidewall of the base substrate.

In some embodiments, a height of an edge of the another part of the first glue layer close to the sidewall of the base substrate in a direction perpendicular to the base substrate is greater than a thickness of the base substrate.

In some embodiments, the first glue layer exposes a surface of the cover plate away from the circuit board.

In some embodiments, a maximum thickness of the first glue layer in a direction perpendicular to the circuit board is less than or equal to a distance between a surface of the cover plate away from the circuit board and the first surface of the circuit board.

According to another aspect of an embodiment of the present disclosure, a display device is provided. The display device comprises the display module described above.

Other features and advantages of the present invention will become apparent from the following detailed description of exemplary embodiments of the present disclosure with reference to the accompanying drawings.

BRIEF DESCRIPTION OF THE DRAWINGS

The accompanying drawings which constitute a part of this specification, illustrate the embodiments of the present disclosure, and together with this specification, serve to explain the principles of the present disclosure.

The present disclosure will be more clearly understood from the following detailed description with reference to the accompanying drawings, in which.

Figure 1:
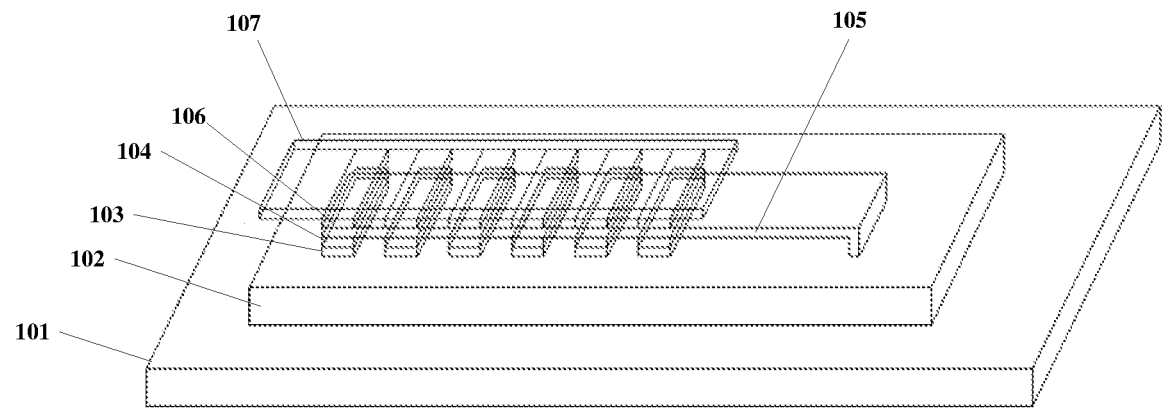
FIG. 1 is a stereoscopic diagram schematically illustrating a structure of a display module in the related art.

It should be understood that the dimensions of various parts shown in the accompanying drawings are not necessarily drawn according to actual proportional relations. In addition, the same or similar components are denoted by the same or similar reference signs.

DESCRIPTION OF THE INVENTION

Various exemplary embodiments of the present disclosure will now be described in detail in conjunction with the accompanying drawings. The description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "include", or the like means that the element before the word covers the element (s) listed after the word without excluding the possibility of also covering other elements. The terms "up", "down", "left", "right", or the like are used only to represent a relative positional relationship, and the relative positional relationship may be changed correspondingly if the absolute position of the described object changes.

In the present disclosure, when it is described that a particular device is located between the first device and the second device, there may be an intermediate device between the particular device and the first device or the second device, and alternatively, there may be no intermediate device. When it is described that a particular device is connected to other devices, the particular device may be directly connected to said other devices without an intermediate device, and alternatively, may not be directly connected to said other devices but with an intermediate device.

All the terms (comprising technical and scientific terms) used in the present disclosure have the same meanings as understood by those skilled in the art of the present disclosure unless otherwise defined. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

FIG. 1 is a stereoscopic diagram schematically illustrating a structure of a display module in the related art.

As shown in FIG. 1, the display module comprises a circuit board 101, a silicon substrate 102 on the circuit board 101, an anode layer 103 on the silicon substrate 102, a light-emitting functional layer 104 on the anode layer 103, a cathode layer 105 on the light-emitting functional layer 104, a color filter layer 106 on the cathode layer 105, and a glass cover plate 107 on the color filter layer 106. Here, the color filter layer 106 is applied to a display module with a color display. If the display module does not require the color display, it may also not have the color filter layer 106. For example, the circuit board 101 is a PCBA (Printed Circuit Board Assembly), which can also be called PCB (Printed Circuit Board) carrier plate. For example, the light-emitting functional layer is an OLED light-emitting film. In some embodiments, the structures (for example, the silicon substrate 102, the anode layer 103, the light-emitting functional layer 104, the cathode layer 105, the color filter layer 106 and the glass cover plate 107) above the circuit board 101 can be collectively referred to as a display substrate. The display module can be a silicon-based OLED module.

The inventors of the present disclosure have found that in the relevant art, during the transportation or mechanical testing of a silicon-based OLED module, an electronic component on the circuit board and the display substrate (such as the glass cover plate and the silicon substrate) are prone to mechanical damage. The reason is that: there are uneven components on a back surface of the circuit board, and during the transportation or mechanical testing, repeated friction and collision may occur at some components, resulting in component damage and problems such as black screen or abnormal display; moreover, the display substrate is relatively thin, and it is easy to cause mechanical damage to the display substrate due to repeated friction and collision during transportation or mechanical testing. For example, the glass cover plate and the silicon substrate (for example, the thickness of which is less than 1 millimeter) are relatively thin, and during the transportation or mechanical testing, repeated friction and collision may occur at the four corners of the glass cover plate and the silicon substrate, resulting in the collapse of the top corners of the glass cover plate or damage to the silicon substrate (there is a circuit on a bottom layer of the silicon substrate), which will lead to module shrinkage, black screen and abnormal display. The above mechanical damage will affect the quality of products.

In view of this, an embodiment of the present disclosure provides a display module to reduce the possibility of mechanical damage to the display module during transportation or mechanical testing.

Figure 2:
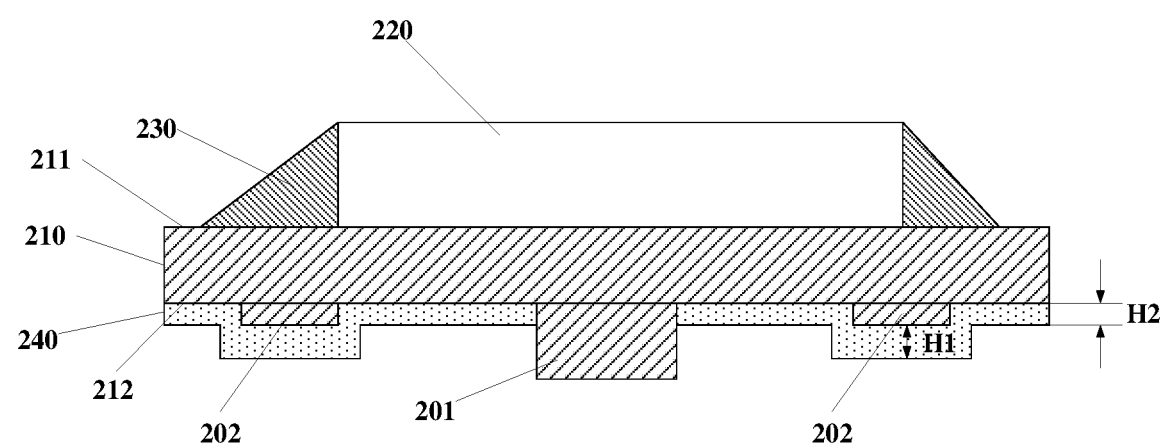
FIG. 2 is a schematic cross section view showing a display module according to an embodiment of the present disclosure.
Figure 3:
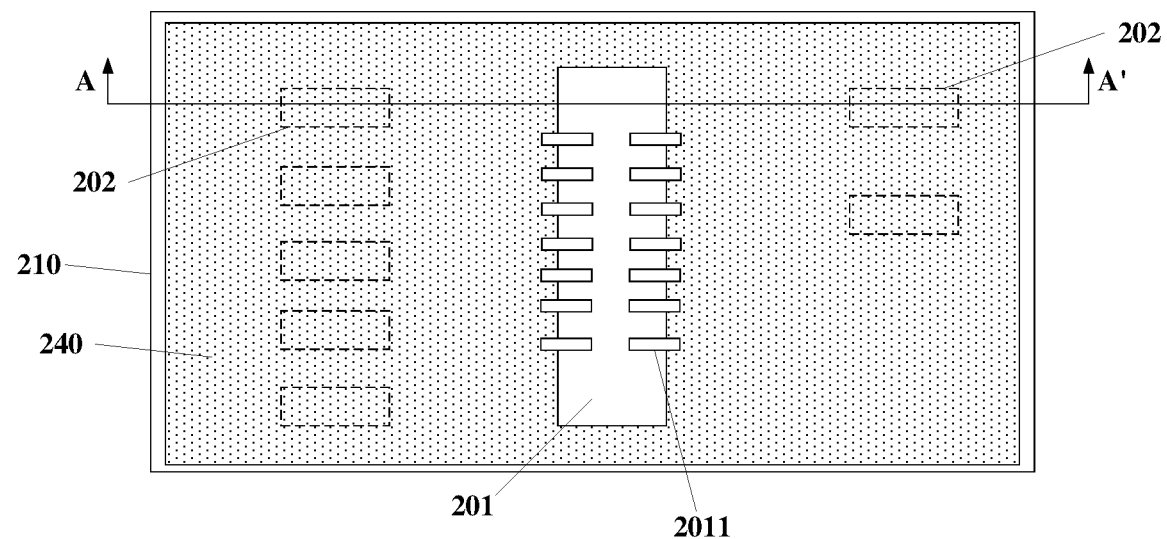
FIG. 3 is a schematic bottom view showing a display module according to an embodiment of the present disclosure.

FIG. 2 is a schematic cross section view showing a display module according to an embodiment of the present disclosure. FIG. 3 is a schematic bottom view showing a display module according to an embodiment of the present disclosure. Here, FIG. 2 is a schematic cross section view showing a structure of the display module, taken along the line A-A' in FIG. 3, according to an embodiment of the present disclosure. The structure of the display module according to the embodiment of the present disclosure will be described in detail below with reference to FIGS. 2 and 3.

As shown in FIGS. 2 and 3, the display module comprises a circuit board 210. The circuit board 210 comprises a first surface 211 and a second surface 212 opposite the first surface 211. For example, the circuit board 211 is a PCBA. Here, the first surface 211 can be a front surface of the circuit board, and the second surface 212 can be a back surface of the circuit board.

As shown in FIG. 2, the display module further comprises a display substrate 220. The display substrate 220 is on the first surface 211 of the circuit board 210.

As shown in FIG. 2, the display module further comprises a first glue layer 230. The first glue layer 230 is on the first surface 211 of the circuit board 210 and surrounds the a sidewall of the display substrate 220. For example, the first glue layer comprises a soft glue layer. For example, a material of the soft glue layer comprises one-component RTV (Room Temperature Vulcanized) adhesive sealing silicone rubber.

As shown in FIGS. 2 and 3, the display module further comprises a second glue layer 240. The second glue layer 240 is on the second surface 212 of the circuit board 210. For example, the second glue layer 240 comprises at least one of a hard glue layer or a soft glue layer. For example, a material of the hard glue layer comprises polydimethylsiloxane elastomer. For example, a material of the soft glue layer comprises one-component RTV adhesive sealing silicone rubber. Here, a transparency of the second glue layer is different from a transparency of the first glue layer. It should be noted that the transparency here means the transmittance of the glue layer.

Heretofore, a display module according to an embodiment of the present disclosure is provided. The display module comprises: a circuit board comprising a first surface and a second surface opposite to the first surface; a display substrate on the first surface of the circuit board; a first glue layer on the first surface of the circuit board and surrounding a sidewall of the display substrate; and a second glue layer on the second surface of the circuit board, wherein a transparency of the second glue layer is different from a transparency of the first glue layer. In this embodiment, the first glue layer surrounding the sidewall of the display substrate is coated on the first surface of the circuit board, and the second glue layer is coated on the second surface of the circuit board. In this way, the first glue layer can protect the display substrate, especially the edges and corners of the display substrate, and the second glue layer can protect the second surface of the circuit board (especially a component on the second surface of the circuit board, which will be described later). In this way, the possibility of mechanical damage to the display module during transportation or mechanical testing can be reduced.

In some embodiments, the transparency of the second glue layer 240 is greater than the transparency of the first glue layer 230. For example, the first glue layer 230 is an non-transparent glue layer; and the second glue layer 240 is a transparent glue layer. In this embodiment, the second glue layer has greater transparency, which can make it easy for a tester to confirm the components on the second surface of the circuit board and facilitate the detection.

In some embodiments, as shown in FIGS. 2 and 3, the circuit board 210 comprises a non-connecting component 202 and a connecting component 201 on the second surface 212 of the circuit board. For example, the connecting component 201 is a connector. For example, as shown in FIG. 3, the connecting component 201 has a plurality of pins 2011. This facilitates the connection of the connecting component to another component outside the display module. The non-connecting component is a component that is not a connector, that is, another component except the connector on the second surface of the circuit board. The non-connecting component is a component known to those skilled in the art, and will not be described in detail here.

As shown in FIG. 2 and FIG. 3, the non-connecting component 202 is covered by the second glue layer 240, and the connecting component 201 is not covered by the second glue layer 240. Here, in FIG. 3, the non-connecting component 202 is shown in dotted lines, representing that the non-connecting component 202 is covered by the second glue layer 240.

In the embodiment, the second glue layer is coated on the back surface of the circuit board (except the connecting component). The second glue layer covers the non-connecting component and can protect the non-connecting component, thus reducing the possibility of peeling-off of the non-connecting component or mechanical damage to the non-connecting component during transportation or mechanical testing of the display module, and thereby avoiding functional defects such as black screen or abnormal display caused by component damage as much as possible. The connecting component is exposed from the second glue layer, so as to facilitate the connection of the connecting component to another component outside the display module.

For example, the connecting component 201 is a male connector, a female connector can be used to cover the male connector, and then the second glue layer 240 can be coated on the second surface of the circuit board, and then, the female connector can be removed, which allows the second glue layer to cover the non-connecting component without covering the connecting component.

In some embodiments, as shown in FIG. 2, a thickness H1 of a part of the second glue layer 240 that covers the non-connecting component 202 in a direction perpendicular to the circuit board 210 is greater than a thickness H2 of another part of the second glue layer 240 that does not cover the non-connecting component 202 in the direction perpendicular to the circuit board 210.

For example, the thickness H1 of the part of the second glue layer 240 that covers the non-connecting component 202 ranges from 0.2 millimeters to 0.3 millimeters. For example, the thickness H2 of the another part of the second glue layer 240 that does not cover the non-connecting component 202 ranges from 0.1 millimeters to 0.2 millimeters.

In the above embodiments, the second glue layer covering the non-connecting component is thicker, which achieves the purpose of strengthening the glue coated to the non-connecting component, thus better preventing damage to the non-connecting component on the back surface of the circuit board. For example, the coating of the glue of the non-connecting component at the highest point among all non-connecting components is strengthened, which can prevent the non-connecting component at the highest point from being damaged.

Figure 4:
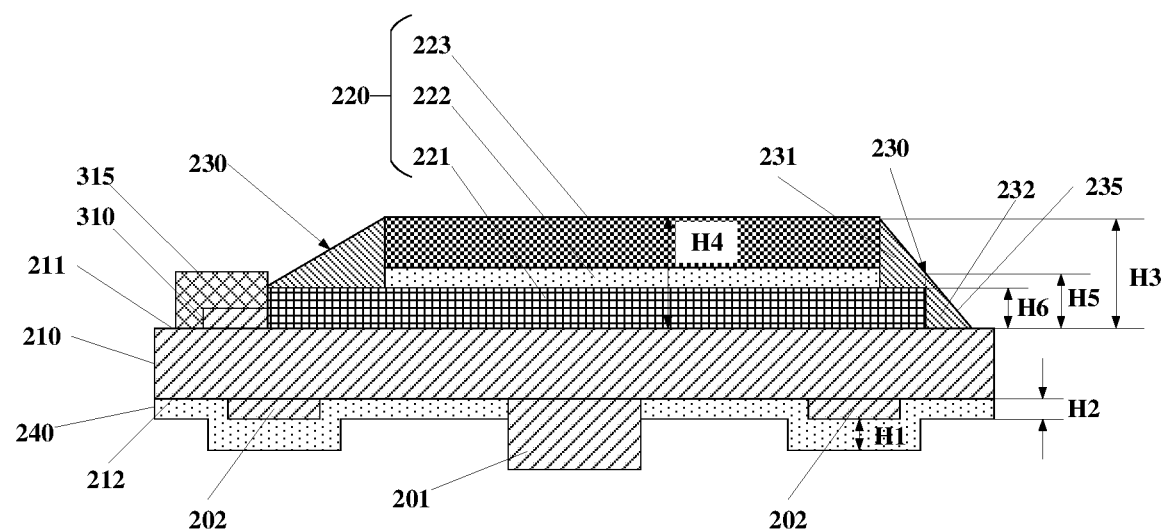
FIG. 4 is a schematic cross section view showing a display module according to another embodiment of the present disclosure.
Figure 5:
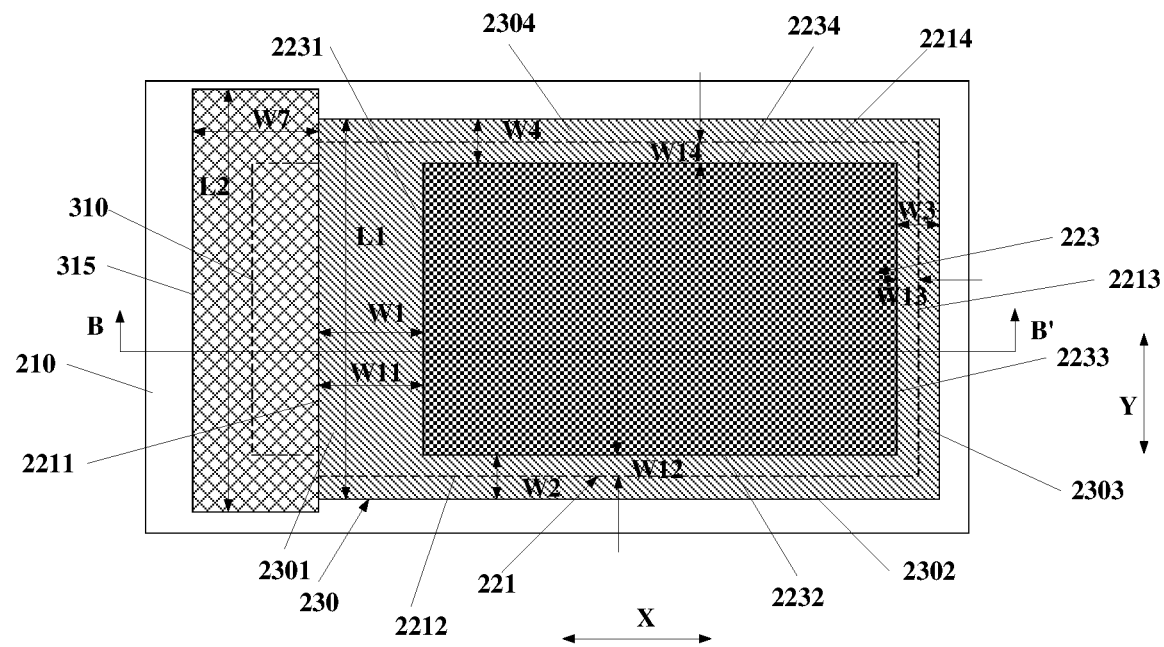
FIG. 5 is a schematic top view showing a display module according to another embodiment of the present disclosure.

FIG. 4 is a schematic cross section view showing a display module according to another embodiment of the present disclosure. FIG. 5 is a schematic top view showing a display module according to another embodiment of the present disclosure. Here, FIG. 4 is a cross-section view showing a structure of the display module taken along the line B-B' in FIG. 5 according to another embodiment of the present disclosure. The structure of the display module according to the embodiment of the present disclosure will be described in detail below with reference to FIGS. 4 and 5.

As shown in FIG. 4, the display module comprises the circuit board 210, the display substrate 220, the first glue layer 230 and the second glue layer 240.

As shown in FIGS. 4 and 5, the display substrate 220 comprises a base substrate 221. The base substrate 221 is on the first surface 211 of the circuit board 210. The base substrate 221 is electrically connected to the circuit board 210 through a conductive connector 310. For example, the base substrate comprises a silicon substrate. The base substrate comprises an integrated circuit. The integrated circuit can be a silicon-based drive circuit (for example, a CMOS (Integrated (Complementary Metal Oxide Semiconductor) driver IC Circuit) circuit). The integrated circuit in the base substrate 221 is electrically connected to the circuit board 210 through the conductive connector 310 (such as a wire). For example, as shown in FIGS. 4 and 5, the conductive connector 310 is covered by a third glue layer 315. That is, the display module can further comprise the third glue layer 315 covering the conductive connector 310. This can protect the conductive connector.

It should be noted that in FIG. 5, the conductive connector 310 is shown by dotted lines to indicate that the conductive connector 310 is covered by the third glue layer 315.

It should also be noted that in FIG. 5, the base substrate 221 is shown by dotted lines to indicate that the base substrate 221 is shielded by a cover plate 223 (described later) and the first glue layer 230.

In some embodiments, a material of the first glue layer 230 is the same as a material of the third glue layer 315. This can simplify the manufacturing process.

As shown in FIG. 4, the display substrate 220 further comprises a light-emitting structure layer 222. The light-emitting structure layer 222 is on a side of the base substrate 221 away from the circuit board 210. The light-emitting structure layer 222 is on the base substrate 221. A structure of the light-emitting structure layer will be described in detail later with reference to FIG. 6.

As shown in FIG. 4, the display substrate 220 further comprises a cover plate 223. The cover plate 223 is on a side of the light-emitting structure layer 222 away from the circuit board 210. For example, the cover plate 223 is a glass cover plate. As shown in FIGS. 4 and 5, an orthographic projection of the cover plate 223 on the circuit board 210 is inside an orthographic projection of the base substrate 221 on the circuit board 210.

As shown in FIGS. 4 and 5, the first glue layer 230 surrounds sidewalls of the base substrate 221, the light-emitting structure layer 222 and the cover plate 223. That is, in a horizontal direction, the first glue layer wraps sidewalls of the base substrate and the cover plate. This can protect the base substrate and the cover plate, reducing the possibility of mechanical damage to the base substrate and the cover plate during transportation or mechanical testing of the display module, and thereby avoiding module shrinkage, black screen, abnormal display and other functional defects caused by edge collapse and damage of the cover plate and the base substrate as much as possible.

As shown in FIGS. 4 and 5, the first glue layer 230 exposes a surface of the cover plate 223 away from the circuit board 210. That is, an upper surface of the cover plate 223 is not covered by the first glue layer. For example, as shown in FIG. 4, a maximum thickness H3 of the first glue layer 230 in a direction perpendicular to the circuit board 210 is less than or equal to a distance H4 between a surface of the cover plate 223 away from the circuit board and the first surface 211 of the circuit board 210. In other words, in a vertical direction, the first glue layer does not exceed the upper surface of the cover plate. This is conducive to the alignment of the display module on a terminal.

In some embodiments, as shown in FIG. 4, a surface 235 of the first glue layer 230 away from the first surface 211 of the circuit board 210 is a curved surface. For example, the curved surface is a concave surface or a convex surface.

In some embodiments, as shown in FIG. 4, a part 231 of the first glue layer 230 is on a surface of the base substrate 221 away from the circuit board and adjacent to sidewalls of the cover plate 223 and the light-emitting structure layer 222, and another part 232 of the first glue layer 230 is on the first surface 211 of the circuit board 210 and adjacent to a sidewall of the base substrate 221. A height H5 of an edge of the another part 232 of the first glue layer 230 close to the sidewall of the base substrate 221 in a direction perpendicular to the base substrate is greater than a thickness H6 of the base substrate 221. Such design can make the first glue layer completely wrap the sidewalls of the base substrate and the cover plate as much as possible, thus protecting the base substrate and the cover plate.

In some embodiments, a shape of the cover plate 223 may be rectangular or nearly rectangular, or curved or other irregular shapes from the perspective of top view. As shown in FIG. 5, the cover plate 223 comprises: a first sidewall 2231 close to the conductive connector 310, a second sidewall 2232 adjacent to the first sidewall 2231, a third sidewall 2233 opposite to the first sidewall 2231, and a fourth sidewall 2234 opposite to the second sidewall 2232. Here, the fourth sidewall 2234 is adjacent to the first sidewall 2231 and the third sidewall 2233, respectively.

As shown in FIG. 5, areas of the base substrate 221 that are not covered by the cover plate are edge areas of the base substrate. For example, the base substrate 221 comprises a first edge area 2211, a second edge area 2212, a third edge area 2213 and a fourth edge area 2214, wherein the first edge area 2211 is an area of the base substrate 221 that is close to the first sidewall 2231 and is not covered by the cover plate 223, the second edge area 2212 is an area of the base substrate 221 that is close to the second sidewall 2232 and is not covered by the cover plate 223, the third edge area 2213 is an area of the base substrate 221 that is close to the third sidewall 2233 and is not covered by the cover plate 223, and the fourth edge area 2214 is an area of the base substrate 221 that is close to the fourth sidewall 2234 and is not covered by the cover plate 223. A width W11 of the first edge area 2211 in a direction perpendicular to an extension direction of the first sidewall is greater than a width W12 of the second edge area 2212 in a direction perpendicular to an extension direction of the second sidewall, the width W11 of the first edge area 2211 in the direction perpendicular to the extension direction of the first sidewall is greater than a width W13 of the third edge area 2213 in a direction perpendicular to an extension direction of the third sidewall, and the width W11 of the first edge area 2211 in the direction perpendicular to the extension direction of the first sidewall is greater than a width W14 of the fourth edge area 2214 in a direction perpendicular to an extension direction of the fourth sidewall. That is to say, instead of being covered by the cover plate 223, the edge areas of the base substrate 221 are exposed, and in exposed parts of the base substrate 221, a width of a part close to the first sidewall of the cover plate is greater than a width of each of parts close to the other three sidewalls of the cover plate.

As shown in FIG. 5, the first glue layer 230 comprises: a first portion 2301 adjacent to the first sidewall 2231, a second portion 2302 adjacent to the second sidewall 2232, a third portion 2303 adjacent to the third sidewall 2233, and a fourth portion 2304 adjacent to the fourth sidewall 2234. Here, the first portion 2301 is on the first sidewall 2231, the second portion 2302 is on the second sidewall 2232, the third portion 2303 is on the third sidewall 2233, and the fourth portion 2304 is on the fourth sidewall 2234. Orthographic projections of the edge areas of the substrate 221 on the circuit board 210 are inside an orthographic projection of the first glue layer 230 on the circuit board 210. The first portion 2301 covers the first edge area 2211 of the base substrate 221, the second portion 2302 covers the second edge area 2212 of the base substrate 221, the third portion 2303 covers the third edge area 2213 of the base substrate 221, and the fourth portion 2304 covers the fourth edge area 2214 of the base substrate 221. That is, the first glue layer covers periphery of the base substrate and the cover plate.

In some embodiments, as shown in FIG. 5, a width W1 of the first portion 2301 in a direction perpendicular to an extension direction of the first sidewall 2231 is greater than a width W2 of the second portion 2302 in a direction perpendicular to an extension direction of the second sidewall 2232. Here, the extension direction of the first sidewall 2231 is a Y direction, and the extension direction of the second sidewall 2232 is an X direction, so the direction perpendicular to the extension direction of the first sidewall 2231 is the X direction, and the direction perpendicular to the extension direction of the second sidewall 2232 is the Y direction.

In some embodiments, the width W1 of the first portion 2301 is greater than twice the width W2 of the second portion 2302. For example, the width W1 of the first portion 2301 ranges from 4 millimeters to 6 millimeters, and the width W2 of the second portion 2302 ranges from 1 millimeter to 2 millimeters.

In some embodiments, as shown in FIG. 5, the width W1 of the first portion 2301 in the direction perpendicular to the extension direction of the first sidewall 2231 is greater than a width W3 of the third portion 2303 in a direction perpendicular to an extension direction of the third sidewall 2233. Here, the extension direction of the third sidewall 2233 is the Y direction, and the direction perpendicular to the extension direction of the third sidewall 2233 is the X direction.

In some embodiments, the width W1 of the first portion 2301 is greater than twice the width W3 of the third portion 2303. For example, the width W1 of the first portion 2301 ranges from 4 millimeters to 6 millimeters, and the width W3 of the third portion 2303 ranges from 1 millimeter to 2 millimeters.

In some embodiments, as shown in FIG. 5, the width W1 of the first portion 2301 in the direction perpendicular to the extension direction of the first sidewall 2231 is greater than a width W4 of the fourth portion 2304 in a direction perpendicular to an extension direction of the fourth sidewall 2234. Here, the extension direction of the fourth sidewall 2234 is the X direction, and the direction perpendicular to the extension direction of the fourth sidewall 2234 is the Y direction.

In some embodiments, the width W1 of the first portion 2301 is greater than twice the width W4 of the fourth portion 2304. For example, the width W1 of the first portion 2301 ranges from 4 millimeters to 6 millimeters, and the width W4 of the fourth portion 2304 ranges from 1 millimeter to 2 millimeters.

In the above embodiment, the width of the first portion of the first glue layer is greater than the width of each of the other three portions of the first glue layer, which can not only make the exposed part of the base substrate close to the first sidewall fully covered by the first glue layer as much as possible, but also reduce the amount of the first glue layer as much as possible, thereby improving the appearance of the display module.

In some embodiments, as shown in FIG. 5, the width W2 of the second portion 2302 in the direction perpendicular to the extension direction of the second sidewall 2232 is equal to the width W3 of the third portion 2303 in the direction perpendicular to the extension direction of the third sidewall 2233, and the width W3 of the third portion 2303 in the direction perpendicular to the extension direction of the third sidewall 2233 is equal to the width W4 of the fourth portion 2304 in the direction perpendicular to the extension direction of the fourth sidewall 2234. That is, the widths of the second, third and fourth portions of the first glue layer are equal. This can simplify the process and improve the appearance of the display module.

In some embodiments, in the coating of the first glue layer 230, an error range of −0.2 millimeters to 0.2 millimeters is allowed for the width W1 of the first portion 2301, the width W2 of the second portion 2302, the width W3 of the third portion 2303 and the width W4 of the fourth portion 2304.

In some embodiments, as shown in FIG. 5, a length L2 of the third glue layer 315 in a direction parallel to the extension direction of the first sidewall 2231 is greater than a length L1 of the first portion 2301 of the first glue layer 230 in the direction parallel to the extension direction of the first sidewall 2231.

In some embodiments, as shown in FIG. 5, the width W1 of the first portion 2301 of the first glue layer 230 in the direction perpendicular to the extension direction of the first sidewall 2231 is less than a width W7 of the third glue layer 315 in the direction perpendicular to the extension direction of the first sidewall 2231.

In some embodiments, as shown in FIG. 5, the third glue layer 315 is connected to the first portion 2301 of the first glue layer 230.

Figure 6:
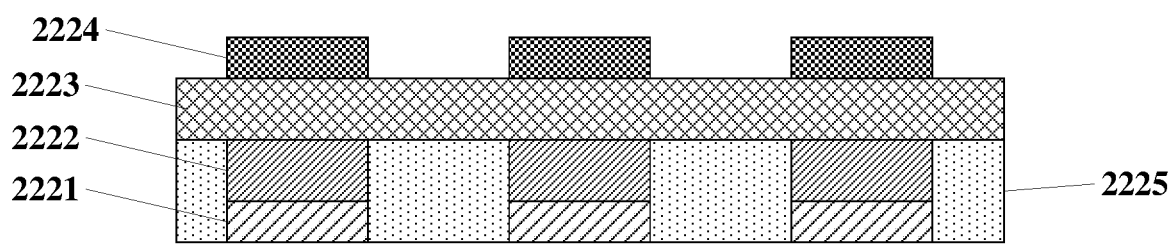
FIG. 6 is a schematic cross section view showing a light-emitting structure layer of a display module according to an embodiment of the present disclosure.

FIG. 6 is a schematic cross section view showing a light-emitting structure layer of a display module according to an embodiment of the present disclosure. FIG. 6 is an enlarged schematic diagram of the light-emitting structure layer 222 in FIG. 4.

As shown in FIG. 6, the light-emitting structure layer 222 comprises a first electrode layer 2221 on a side 210 of the base substrate 221 (not shown in FIG. 6, and reference can be made to FIG. 4) away from the circuit board (see FIG. 4) 210. For example, the first electrode layer is an anode layer.

As shown in FIG. 6, the light-emitting structure layer 222 further comprises a light-emitting functional layer 2222 on a side of the first electrode 2221 away from the circuit board (see FIG. 4) 210. For example, the light-emitting functional layer 2222 comprises an OLED light-emitting film.

As shown in FIG. 6, the light-emitting structure layer 222 further comprises a second electrode layer 2223 on a side of the light-emitting functional layer 2222 away from the circuit board (see FIG. 4) 210. For example, the second electrode layer 2223 is a cathode layer.

Heretofore, a light-emitting structure layer of a display module according to an embodiment of the present disclosure is provided. The light-emitting structure layer comprises the first electrode layer, the light-emitting function layer and the second electrode layer.

In some embodiments, the light-emitting structure layer 222 further comprises a color filter layer 2224 on a side of the second electrode layer 2223 away from the light-emitting functional layer 2222. This enables the display module to realize color display. Of course, those skilled in the art can understand that it is also possible to not provide the color filter layer if color display is not needed for the display module.

In some embodiments, the light-emitting structure layer 222 further comprises a pixel defining layer 2225. The pixel defining layer 2225 has an opening. The first electrode layer 2221 and the light-emitting functional layer 2222 are in the opening.

It should be noted that the above light-emitting structure layer can also comprise other structural layers known to those skilled in the art, which will not be described in detail here.

In other embodiments, for a flexible display module (for example, a silicon-based OLED FPC (Flexible Printed Circuit) module), a glue layer (for example, soft silicone) can be coated on the sidewall of the cover plate and the sidewall of the base substrate of the flexible display module. Similar to the first glue layer 230 described above, in the horizontal direction, the glue layer wraps the sidewall of the cover plate and the sidewall of the base substrate. In the vertical direction, the glue layer does not exceed the upper surface of the cover plate. In this way, the possibility of mechanical damage to the flexible display module during transportation or mechanical testing can be reduced.

According to some embodiments of the present disclosure, a display device is also provided. The display device comprises the display module described above, for example, the display module shown in FIGS. 2 to 5. For example, the display device may be any product or component having a display function, such as a display panel, a mobile phone, a tablet computer, a television, a display, a notebook computer, a digital photo frame, a navigator, or the like.

Heretofore, various embodiments of the present disclosure have been described in detail. In order to avoid obscuring the concepts of the present disclosure, some details known in the art are not described. Based on the above description, those skilled in the art can understand how to implement the technical solutions disclosed herein.

Although some specific embodiments of the present disclosure have been described in detail by way of examples, those skilled in the art should understand that the above examples are only for the purpose of illustration but not for limiting the scope of the present disclosure. It should be understood by those skilled in the art that modifications to the above embodiments or equivalently substitution of part of the technical features may be made without departing from the scope and spirit of the present disclosure. The scope of the present disclosure is defined by the appended claims.

What is claimed is:

1. A display module, comprising:
 a circuit board, comprising a first surface and a second surface opposite to the first surface;
 a display substrate on the first surface of the circuit board;
 a first glue layer on the first surface of the circuit board and surrounding a sidewall of the display substrate; and
 a second glue layer on the second surface of the circuit board, wherein a transparency of the second glue layer is different from a transparency of the first glue layer;
 wherein the circuit board comprises:
 a non-connecting component and a connecting component on the second surface of the circuit board, wherein the non-connecting component is covered by the second glue layer, and the connecting component is not covered by the second glue layer.

2. The display module according to claim 1, wherein the transparency of the second glue layer is greater than the transparency of the first glue layer.

3. The display module according to claim 2, wherein:
 the first glue layer is an non-transparent glue layer; and
 the second glue layer is a transparent glue layer.

4. The display module according to claim 1, wherein a thickness of a part of the second glue layer that covers the non-connecting component in a direction perpendicular to the circuit board is greater than a thickness of another part of the second glue layer that does not cover the non-connecting component in the direction perpendicular to the circuit board.

5. The display module according to claim 4, wherein:
the thickness of the part of the second glue layer that covers the non-connecting component ranges from 0.2 millimeters to 0.3 millimeters; and
the thickness of the another part of the second glue layer that does not cover the non-connecting component ranges from 0.1 millimeters to 0.2 millimeters.

6. The display module according to claim 1, wherein:
the first glue layer comprises a soft glue layer; and
the second glue layer comprises at least one of a hard glue layer or a soft glue layer.

7. The display module according to claim 1, wherein the display substrate comprises:
a base substrate on the first surface of the circuit board, wherein the base substrate is electrically connected to the circuit board through a conductive connector;
a light-emitting structure layer on a side of the base substrate away from the circuit board; and
a cover plate on a side of the light-emitting structure layer away from the circuit board, an orthographic projection of the cover plate on the circuit board being inside an orthographic projection of the base substrate on the circuit board;
wherein the first glue layer surrounds sidewalls of the base substrate, the light-emitting structure layer, and the cover plate.

8. The display module according to claim 7, wherein:
the cover plate comprises: a first sidewall close to the conductive connector, a second sidewall adjacent to the first sidewall, a third sidewall opposite to the first sidewall, and a fourth sidewall opposite to the second sidewall;
the base substrate comprises a first edge area, a second edge area, a third edge area and a fourth edge area, wherein the first edge area is an area of the base substrate that is close to the first sidewall and is not covered by the cover plate, the second edge area is an area of the base substrate that is close to the second sidewall and is not covered by the cover plate, the third edge area is an area of the base substrate that is close to the third sidewall and is not covered by the cover plate, and the fourth edge area is an area of the base substrate that is close to the fourth sidewall and is not covered by the cover plate; and
the first glue layer comprises: a first portion adjacent to the first sidewall, a second portion adjacent to the second sidewall, a third portion adjacent to the third sidewall, and a fourth portion adjacent to the fourth sidewall, wherein the first portion covers the first edge area of the base substrate, the second portion covers the second edge area of the base substrate, the third portion covers the third edge area of the base substrate, and the fourth portion covers the fourth edge area of the base substrate.

9. The display module according to claim 8, wherein:
a width of the first portion in a direction perpendicular to an extension direction of the first sidewall is greater than a width of the second portion in a direction perpendicular to an extension direction of the second sidewall;
the width of the first portion in the direction perpendicular to the extension direction of the first sidewall is greater than a width of the third portion in a direction perpendicular to an extension direction of the third sidewall; and
the width of the first portion in the direction perpendicular to the extension direction of the first sidewall is greater than a width of the fourth portion in a direction perpendicular to an extension direction of the fourth sidewall.

10. The display module according to claim 9, wherein:
the width of the first portion is greater than twice the width of the second portion;
the width of the first portion is greater than twice the width of the third portion; and
the width of the first portion is greater than twice the width of the fourth portion.

11. The display module according to claim 8, wherein a width of the second portion in a direction perpendicular to an extension direction of the second sidewall is equal to a width of the third portion in a direction perpendicular to an extension direction of the third sidewall, and the width of the third portion in the direction perpendicular to the extension direction of the third sidewall is equal to a width of the fourth portion in a direction perpendicular to an extension direction of the fourth sidewall.

12. The display module according to claim 8, further comprising:
a third glue layer covering the conductive connector, wherein a length of the third glue layer in a direction parallel to an extension direction of the first sidewall is greater than a length of the first portion of the first glue layer in the direction parallel to the extension direction of the first sidewall.

13. The display module according to claim 12, wherein a width of the first portion of the first glue layer in a direction perpendicular to the extension direction of the first sidewall is less than a width of the third glue layer in the direction perpendicular to the extension direction of the first sidewall.

14. The display module according to claim 12, wherein the third glue layer is connected to the first portion of the first glue layer; and/or
a material of the first glue layer is the same as a material of the third glue layer.

15. The display module according to claim 7, wherein a part of the first glue layer is on a surface of the base substrate away from the circuit board and adjacent to sidewalls of the cover plate and the light-emitting structure layer, and another part of the first glue layer is on the first surface of the circuit board and adjacent to a sidewall of the base substrate.

16. The display module according to claim 15, wherein a height of an edge of the another part of the first glue layer close to the sidewall of the base substrate in a direction perpendicular to the base substrate is greater than a thickness of the base substrate.

17. The display module according to claim 7, wherein the first glue layer exposes a surface of the cover plate away from the circuit board; and/or
a maximum thickness of the first glue layer in a direction perpendicular to the circuit board is less than or equal to a distance between a surface of the cover plate away from the circuit board and the first surface of the circuit board.

18. The display module according to claim 1, wherein a surface of the first glue layer away from the first surface of the circuit board is a curved surface.

19. A display device, comprising: the display module according to claim 1.

20. A display module, comprising:
a circuit board, comprising a first surface and a second surface opposite to the first surface;
a display substrate on the first surface of the circuit board;

a first glue layer on the first surface of the circuit board and surrounding a sidewall of the display substrate; and a second glue layer on the second surface of the circuit board, wherein a transparency of the second glue layer is different from a transparency of the first glue layer;

wherein the display substrate comprises:

a base substrate on the first surface of the circuit board, wherein the base substrate is electrically connected to the circuit board through a conductive connector;

a light-emitting structure layer on a side of the base substrate away from the circuit board; and a cover plate on a side of the light-emitting structure layer away from the circuit board, an orthographic projection of the cover plate on the circuit board being inside an orthographic projection of the base substrate on the circuit board;

wherein the first glue layer surrounds sidewalls of the base substrate, the light-emitting structure layer, and the cover plate.

* * * * *